United States Patent [19]

Seifert

[11] Patent Number: 4,982,157

[45] Date of Patent: Jan. 1, 1991

[54] SUPERCONDUCTING GRADIOMETER LOOP SYSTEM OF A MULTICHANNEL MEASURING DEVICE

[75] Inventor: Heinrich Seifert, Bubenreuth, Fed. Rep. of Germany

[73] Assignee: Siemens Aktiengesellschaft, Berlin & Munich, Fed. Rep. of Germany

[21] Appl. No.: 408,102

[22] Filed: Sep. 15, 1989

[30] Foreign Application Priority Data

Sep. 22, 1988 [DE] Fed. Rep. of Germany ....... 3832129

[51] Int. Cl.⁵ .................... G01R 33/35; G01R 33/22
[52] U.S. Cl. .................................. 324/248; 505/846
[58] Field of Search ................ 324/248; 128/653 R; 336/200, 206, DIG. 1; 505/846

[56] References Cited

U.S. PATENT DOCUMENTS

| | | | |
|---|---|---|---|
| 3,736,543 | 5/1973 | Lademann et al. | 336/200 |
| 4,246,446 | 1/1981 | Yoshida et al. | 336/200 X |
| 4,313,151 | 1/1982 | Vranken | 336/200 X |
| 4,591,787 | 5/1986 | Hoenig | 324/248 |
| 4,761,611 | 8/1988 | Hoenig | 324/248 |

FOREIGN PATENT DOCUMENTS

| | | |
|---|---|---|
| 0111827 | 6/1984 | European Pat. Off. . |
| 0130490 | 1/1985 | European Pat. Off. . |
| 0185186 | 6/1986 | European Pat. Off. . |
| 0210489 | 2/1987 | European Pat. Off. ............ 324/248 |

OTHER PUBLICATIONS

J. Phys. E.: Sci. Instrum., vol. 13, 1980, pp. 801–832.
IEEE Trans. Electron Dev., vol. ED-27, No. 19, oct. 1980, pp. 1896–1908
Biomagnetism Proceedings, Third International Workshop on Biomagnetism, Berlin, 1980, Berlin/New York, 1981, pp. 3–31.

Primary Examiner—Gerard R. Strecker
Attorney, Agent, or Firm—Kenyon & Kenyon

[57] ABSTRACT

A gradiometer loop system is provided for a device for the multi-channel measurement of very weak magnetic fields where the superconducting gradiometer loops are combined in at least one array and arranged on a carrier body and, like superconducting connecting leads to be connected to them are designed as thin film structures. The gradiometer loops are arranged on the two flat sides of a carrier foil distributed such that together they occupy an at least approximately closed array area, and the connecting leads are designed in the region of the array area placed so that they are shielded at least largely by means of conductor runs to gradiometer loops located on the respective opposite flat side of the carrier foil.

10 Claims, 4 Drawing Sheets

SUPERCONDUCTING GRADIOMETER LOOP SYSTEM OF A MULTICHANNEL MEASURING DEVICE

BACKGROUND OF THE INVENTION

The present invention relates to a gradiometer loop system of a device for the multichannel measurement of magnetic fields. Such a gradiometer loop system is known from European Pat. No. B-O 111 827.

For measuring very weak magnetic fields, the use of superconducting quantum interferometers, so-called "SQUIDs" (abbreviation for: Superconducting Quantum Interference Devices) is generally known. (See, for instance, "J. Phys. E.: Sci. Instr.", Vol. 13, 1980, pages 801 to 832 or "IEEE Trans. Electron Dev.", Vol. ED-27, No. 10, October 1980, pages 1896 to 1908). A preferred field of application for these interferometers is the field of medical diagnostics, magnetocardiography or magnetoencephalography, because the magnetic fields caused by magnetic heart or brainwaves have field strengths in the order of magnitude of only about 50 pT or 0.1 pT (see, for instance, "Biomagnetism-Proceedings Third International Workshop on Biomagnetism, Berlin 1980, Berlin/New York, 1981, pages 3 to 31). In addition, it should be possible to detect these very weak fields also in the presence of comparatively large interference fields. For measuring such biomagnetic fields in the order of magnitude mentioned, measuring devices are known which can be designed as single or, in particular multichannel devices. Generally, such a measuring device contains per channel a gradiometer of superconducting gradiometer loops, a SQUID as well as superconducting leads extending between the SQUID and the gradiometer loops. The loop facing the magnetic field source to be detected is designated also as the detection loop, while the loop spatially further removed therefrom can be considered as a compensation loop. With such a loop system the magnetic flux of the field source can advantageously be measured directly, and very high sensitivity and good discrimination against external interference fields can be achieved therewith.

The gradiometer loops as well as the corresponding connecting leads can be constructed, for instance, of superconducting wire, where the connecting leads can additionally be located in a superconducting shielding device. In general, however, only round loops can be made of wire with the required accuracy. In addition, the connecting leads cannot be contacted free of inductance and insensitive of fields. Furthermore, in the case of multichannel measuring devices, very many individual units must be handled. Instead of using discrete superconducting wires, the gradiometer loops and the corresponding connecting leads can also be deposited as thin-film conductors on carrier foils. The coated carrier foils are then applied to a carrier body with pronouncedly three-dimensional shape (see, for instance, European Pat. Application No. AO 185 186). In this embodiment, however, it cannot be avoided that the connecting leads forming pairs of parallel conductors are likewise field-sensitive due to their only finite conductor spacing.

In the multichannel measuring device known from the European Patent mentioned at the outset, the detection loops and the compensation loops are combined to form a planar field, a so-called array. The two loop arrays are arranged on two opposite flat sides of a three-dimensional carrier body. In this measuring device, however, the array area available for each array cannot be utilized completely for the gradiometer loops, because adjacent loops must be spaced sufficiently to bring the required connecting leads through. In this connection, it cannot be avoided that the connecting leads arranged there are field sensitive.

SUMMARY OF THE INVENTION

It is therefore an object of the present invention to provide a gradiometer loop system of a device for the multichannel measurement of weak magnetic fields such that optimum utilization of the array areas becomes possible In addition, any field sensitivity of the connecting leads should at least largely be suppressed.

The above and other objects of the invention are achieved by a gradiometer loop system of a device for the multi-channel measurement of weak magnetic fields caused by at least one field source, which device contains in each channel a superconducting gradiometer with at least one gradiometer loop, a SQUID as well as superconducting connecting leads between the loop and the SQUID where the gradiometer loops combined in at least one array are arranged on a carrier body and are designed, like the connecting leads, as thin film structures, and further wherein the gradiometer loops are arranged on the two flat sides of a carrier foil distributed such that together they occupy an at least approximately closed array area, the connecting leads being designed in the region of the array area such that they are shielded at least largely by means of conductor runs of gradiometer loops located on the respective opposite flat side of the carrier foil, and the carrier foil being applied with its array area to the carrier body.

In the embodiment of the gradiometer loop system according to the invention, the individual gradiometer loops as well as the corresponding connecting leads are formed on a carrier foil in a manner known per se (see, European Pat. Application No. A-O 185 186). To this end, both sides of the carrier foils are advantageously used. It can be achieved in this manner that the gradiometer loops of an array can be packed with respect to each other so densely that practically only minimal spaces for mutual electrical insulation remain between them. The electrical connection of the individual loops in the range of an array is then accomplished via connecting leads which follow the contour of conductor runs which form gradiometer loops located on the respective opposite flat side. In this manner, the gradiometer loops serve at the same time also as a magnetic shield for the connecting leads. The arrangement of the individual loops on the two sides of a carrier foil is consequently chosen also with consideration of the connecting leads required for their electrical connection. It can advantageously be achieved thus that through-contacts in the vicinity of the part occupied by an array and designated as an "array area" or "array zone" of the foil are avoided. With such gradiometer loop arrays on the carrier foils, gradiometers of null, first or higher order can then be designed without difficulty by applying these carrier foils on a number of flat sides determined by the order of the gradiometer of at least one carrier body and connecting the connecting leads brought out from the array zone together accordingly.

BRIEF DESCRIPTION OF THE DRAWINGS

The invention will be described in greater detail in the following detailed description with reference to the drawings, in which.

DETAILED DESCRIPTION

In the figures, corresponding parts are provided with the same reference symbols.

As an embodiment, a measuring device for magneto encephalography or magnetocardiography will be taken as a base in the following which comprises a 37-channel first-order gradiometer with three magnetometer channels. The gradiometer is assumed to be composed of two carrier foils each covered with a corresponding number of gradiometer loops. The gradiometer loop system so obtained is to be connected to SQUIDs by the required connecting leads via four carrier foils.

Figure 1:
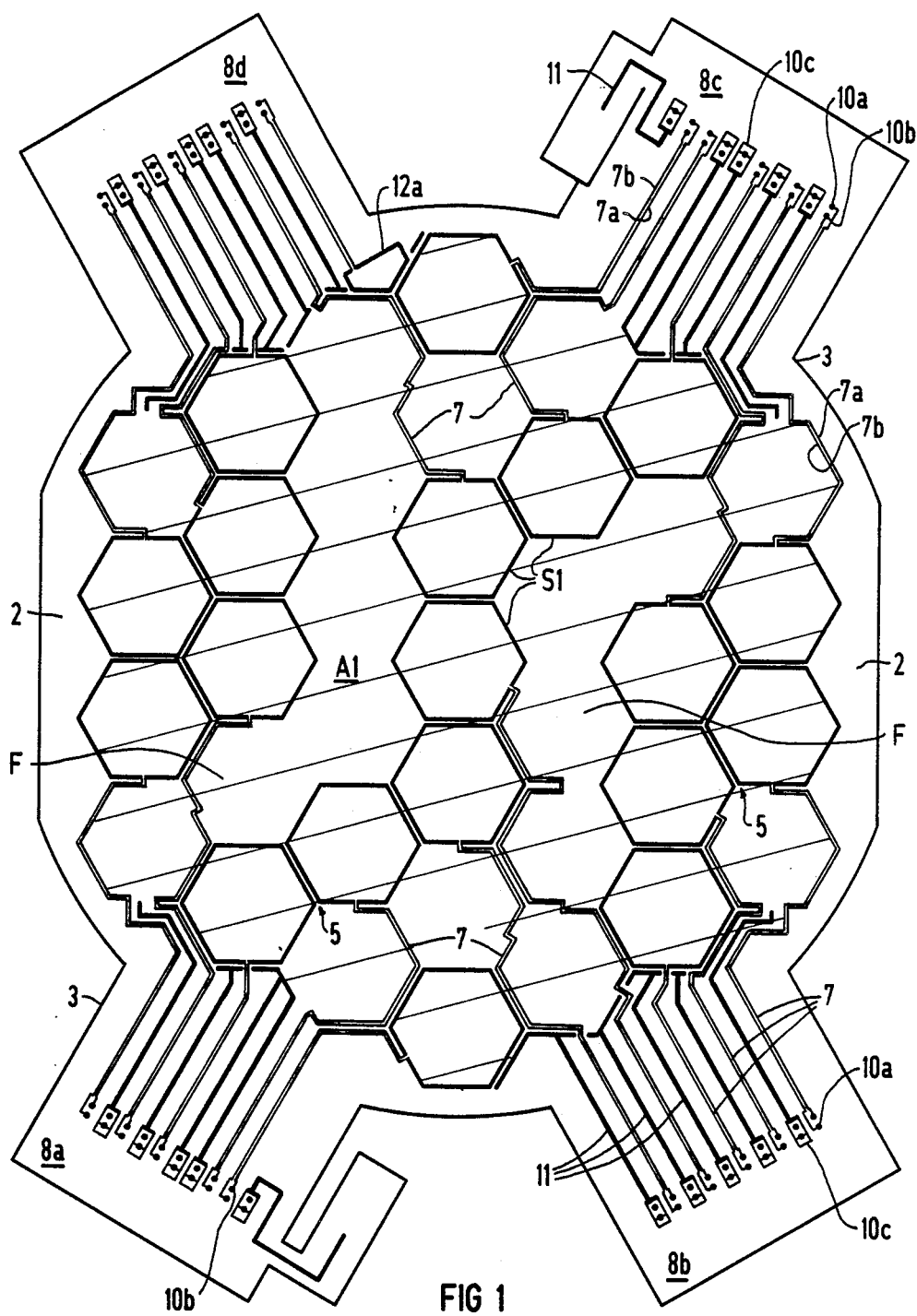
FIGS. 1 and 2 show schematically the two flat sides of a carrier foil provided with a gradiometer loop array.

From the top view visible in FIG. 1 onto one flat side 2 of a flexible carrier foil 3 known per se, a part A1 of an array of hexagonal superconducting gradiometer loops of coils is visible. The remaining gradiometer loops of this array can be seen from a corresponding presentation of FIG. 2 and form an array part A2 there. The part of the carrier foil 3 covered by the overall array will be designated in the following as the "array area" F and is indicated in FIG. 1 by shading. This area is determined by 37 gradiometer loops according to the number of the provided channels of the measuring device. These gradiometer loops are arranged on both sides of the carrier foil 3 in such a manner that, on the one hand, they do not overlap, but on the other hand, make possible packing as densely as possible. It will be assumed that the array shown in FIGS. 1 and 2 and composed of the array parts A1 and A2 is to be located on the side facing a magnetic field source to be detected of a carrier body with pronounced three-dimensional shape. Its gradiometer loops can then be considered as detection loops. A further carrier foil covered with a corresponding array of gradiometer loops is applied to a surface of the carrier body opposite and parallel thereto. Its gradiometer loops can therefore also be considered as compensation loops.

According to FIG. 1, only 19 of the 37 detection loops of the array part A1 are formed on the flat side 2 and are uniformly designated with S1. Adjacent detection loops are separated only by an insulating gap 5. Every detection loop is connected to a SQUID via superconducting connecting leads. Only parts 7a and 7b of these connecting leads are deposited on the flat side 2. The two parts respectively associated with a gradiometer loop S1 are designed here advantageously as a twin line 7 for conducting the current out and back. These twin lines lead, without forming crossings, from the area of the array zone F to four rows 8a to 8d of connecting points 10a, 10b. In the zone of the area F, the position of the individual detection loops S1 as well as the arrangement of the twin lines 7 are chosen so that these twin lines come to lie exactly above the superconducting conductor runs of the detection loops of the array part A2 which is formed on the opposite flat side of the carrier foil. In this manner, the conductor runs of the gradiometer loops represent shields against undesired magnetic field influences for the parts covered up by them.

In order to achieve also outside the zone of the array area F, suitable shielding of the twin lines with opposing current flow direction, additional conductor runs are provided on the respective opposite flat side, which run in accordance with the parts to the shielded. In FIG. 1, such shielding conductors are designated with 11. They are wide enough to cover the twin lines lying in the plane with shielding action. The shielding conductors 11 are connected at contact points 10c of the row 8a to 8d.

As can further be seen from FIG. 1, a magnetometer loop 12a for detecting the not compensated magnetic field can be provided at the periphery of the array area F in a corner formed by two detection loops.

Figure 2:
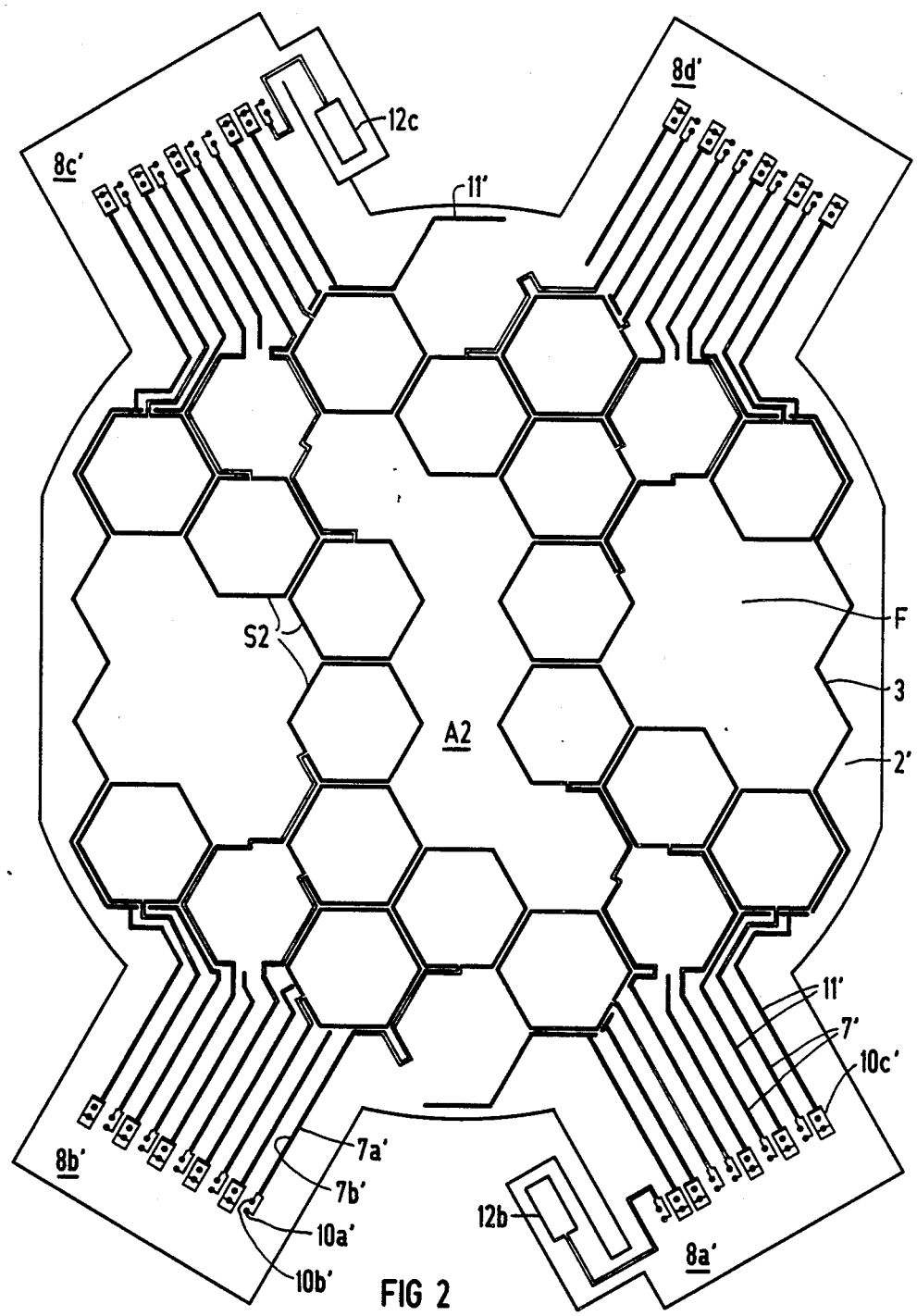

From FIG. 2, a top view on the opposite (lower) flat side 2' of the carrier foil 3 can be seen. On this flat side, 18 detection loops S2 of an array part A2 are arranged so that, together with the 19 detection loops S1 according to FIG. 1, they practically cover the array area completely, i.e., without major insulating gaps 5. The partial sections 7a' and 7b' of the superconducting connecting leads are placed so that they are shielded against the magnetic fields to be detected as well as interference fields by conductor runs of the detection loops located on the opposite (upper) flat side. For this purpose, the sections 7a' and 7b' are likewise designed also as twin lines 7'. From the figure can further be seen rows 8a' to 8d' for connecting points 10a' to 10c' for the conductor sections 7a' and 7b' as well as for shielding conductors 11'. In addition, two magnetometer loops 12b and 12c are further located on the flat side 2'.

Figure 3:
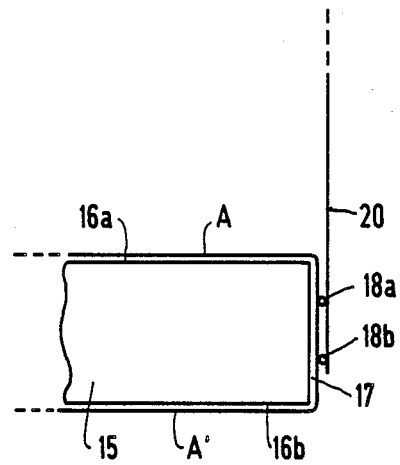
FIG. 3 shows the mechanical designs of a gradiometer loop system with such gradiometer loop arrays.

A further array of compensation loops required for a first-order gradiometer can be designed advantageously like the array A1+A2, illustrated in FIGS. 1 and 2, of the detection loops S1+S2. The mechanical design of such a gradiometer or gradiometer loop system of two such arrays is indicated in FIG. 3. From the cross sections of this figure through part of the gradiometer a carrier body 15 with pronounced 3-dimensional shape, for instance, of cylindrical shape, can be seen. On its opposite flat end faces 16a, 16b, the array A of detection loops and the array A' of compensation loops are arranged, respectively. For instance, the corresponding carrier foils 3 and 3a of these arrays are cemented-on there. The parts of the carrier foils extending beyond the respective array area are bent out of the parallel planes of the end faces 16a, 16b into a lateral surface 17 perpendicular thereto. There, the further parts of the superconducting connecting lines are soldered to their rows of connecting points. The solder joints formed, for instance, at the rows 8b and 8b' are designated with 18 and 18a, respectively. The parts of the superconducting connecting leads to be provided between these solder joints and terminals of associated SQUIDs are advantageously designed likewise as ribbon-shaped feed foils. An embodiment of such a feed foil for the detection loops S1, S2 of the array A can be seen from FIGS. 4 and 5.

Figure 4:
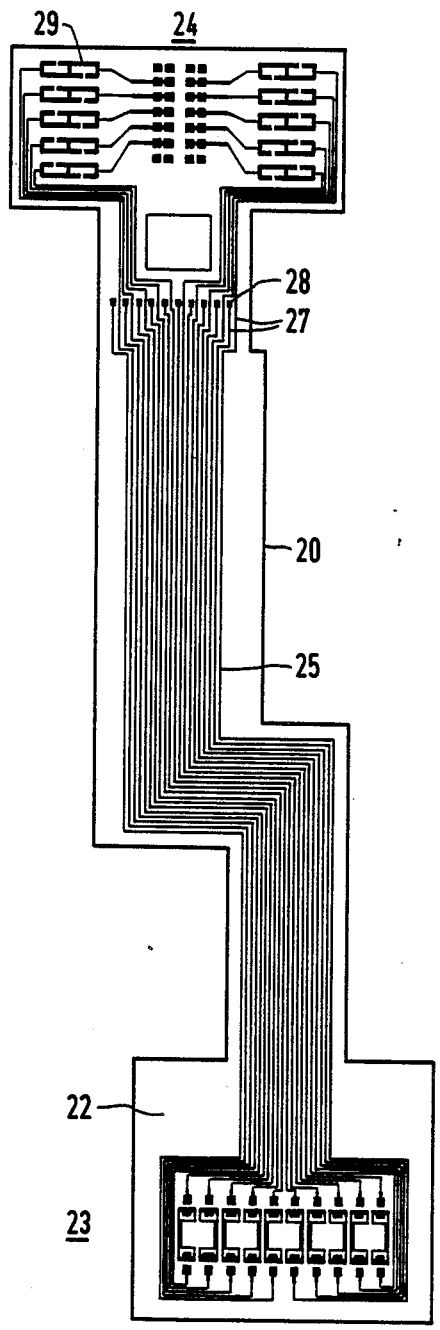
FIGS. 4 and 5 show connecting lines designed as foil conductors for the gradiometer loops.
Figure 5:
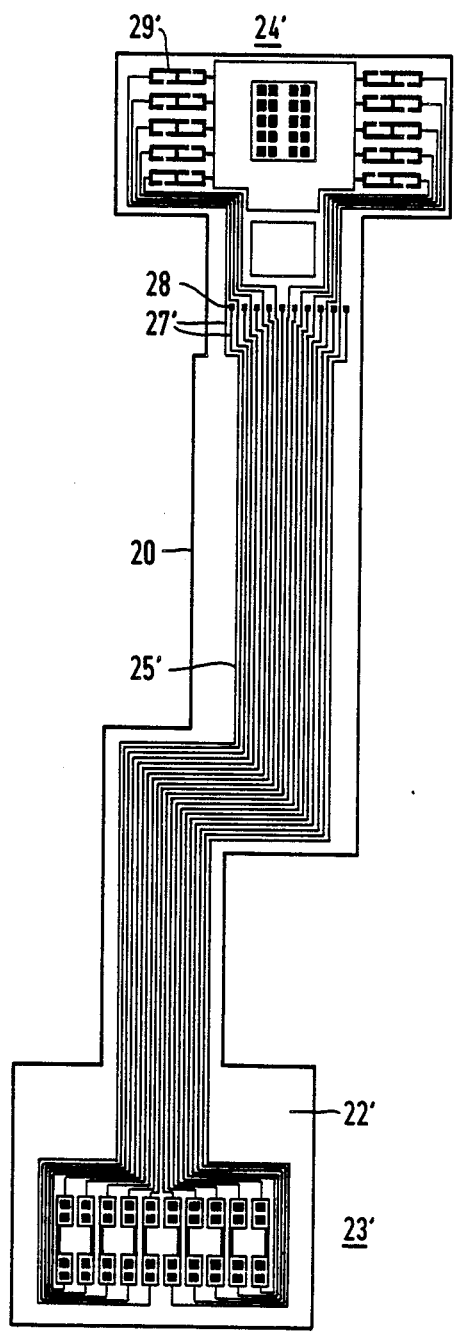

From FIG. 4, a view on the one (upper) flat side 22 of a feed foil can be seen. On this foil parts of the superconducting connecting leads running between rows of terminals 23, 24, are deposited as closely spaced mutually parallel conductor runs 25. A top view onto the corresponding lower flat side 22' of the foil 20 can be seen from FIG. 5. There, the terminal rows covering up the terminal rows 23 and 24 of FIG. 4, are designated with 23' and 24', respectively, as well as the conductor runs designated with 25'. On the feed foil 20, the individual conductor runs are placed also in the vicinity of the terminal rows so that sufficient shielding is achieved. For this purpose, additional conductor runs 27 and 27' are provided on both flat sides 22 and 22' which are arranged on top of each other in pairs. These additional conductor runs are short-circuited with each other at the edge of the zone of the terminal rows 24 and 24' to contact points 28 going through the feed foil 20. As can further be seen from FIGS. 4 and 5, transformer loops 29 and 29' for feedback coupling are formed by the conductor runs 25 and 25' in the vicinity of the terminal rows 24 and 24'.

Figure 6:
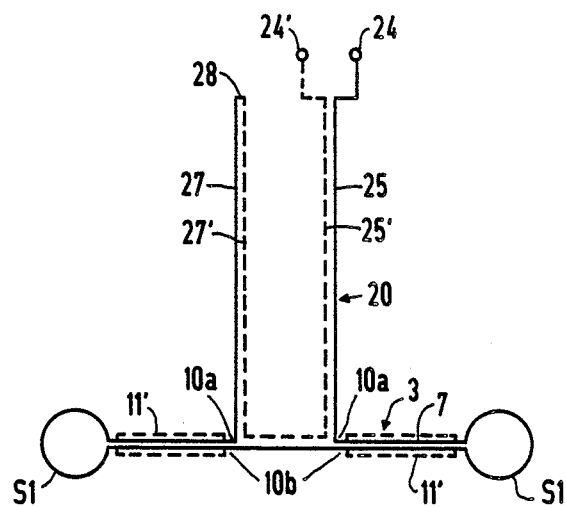
FIG. 6 shows the electrical line arrangement for these connecting leads.

The arrangement of the electrical leads for connecting the individual gradiometer loops to the corresponding SQUIDs via the superconducting connecting leads can be seen from the sketch of FIG. 6. In this figure, the conductor parts on the upper flat sides 22 and 2 are shown by solid lines, while the parts deposited on the opposite (lower) flat sides 22' and 2' are shown by dashed lines. In the figure are further indicated also the two shielding conductors 11', which cover the twin lines 7 of the superconducting connecting leads between a row of terminal points 10a, 10b and individual detection loops S1.

For the gradiometer indicated in the figures, still further feed foils are required which are to be connected between the rows of the terminal points of the individual gradiometer loops and the associated SQUIDs. These additional feed foils are to be designed and connected in accordance with the presentation of FIGS. 4 to 6. All feed foils can be arranged particularly on at least one carrier structure which is connected rigidly to the carrier bodies for the gradiometer loop arrays (see European Pat. No. EP-B-0 111 827).

The gradiometer loop system in foil design, indicated in the figure, is characterized particularly by the following features:

The available array area is utilized practically fully by the gradiometer loops, since their leads are run within the zone of the loops.

The leads in the array area are designed as covered twin lines, where the loops themselves are used for covering the individual conductor runs.

By utilizing the two metallization layers of a carrier foil for the loops as well as for the leads, no through-contacts are required in the array zone.

The feed lines outside the array zones are designed as twin strip lines which are connected so that the lines become insensitive to homogeneous magnetic fields.

The gradiometer loop system is subdivided into two foil types, namely, foils for the gradiometer loops and foils for the connecting leads. The conductor runs of these two foil types can be connected by magnetically shielded solder joints. By this division, the size of the foil circuits to be fabricated can be kept small.

According to the embodiment shown in the figures, a first-order gradiometer was assumed. Equally well, also null or higher-order gradiometers can be made by the measures of the invention, of which the arrays formed on the carrier foils are then applied to a number of surfaces of the carrier body determined by the order. The corresponding carrier body can also be composed of several parts.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. Superconducting gradiometer loop system of a device for the multi-channel measurement of weak magnetic fields caused by at least one field source, the device having a plurality of measurement channels, each measurement channel comprising a superconducting gradiometer having at least one gradiometer loop, a SQUID and superconducting connecting leads between the gradiometer loop and the SQUID, the gradiometer loops of each of the channels being combined in at least one array arranged on a carrier body, the gradiometer loops of each of the channels and connecting leads of each of the channels comprising thin film structures such that the gradiometer loops of each of the channels are arranged on two flat sides of a carrier foil distributed such that together the gradiometer loops of each of the channels occupy an at least approximately closed array area, the connecting leads of each of the channels in the region of the array area being arranged on the two flat sides of the carrier foil such that the connecting leads are shielded at least largely by conductor runs of gradiometer loops located on the respective opposite flat side of the carrier foil and the carrier foil being applied with the array area to the carrier body.

2. The gradiometer loop system recited in claim 1, wherein the gradiometer loops of the gradiometer of first or higher order form at least one array of detection loops and an array of compensation loops, and said arrays being arranged on surfaces located in parallel planes, of a carrier body with pronouncedly three-dimensional shape.

3. The gradiometer loop system recited in claim 1, wherein the superconducting connecting leads comprise feed foils outside the foils carrying the gradiometer loops.

4. The gradiometer loop system recited in claim 3, wherein the conductor runs of the superconducting connecting leads are arranged on the two flat sides of the feed foils.

5. The gradiometer loop system recited in claim 3, wherein between the carrier foils for the gradiometer loops and the feed foils rows of connecting points for the superconducting connecting leads are provided.

6. The gradiometer loop system recited in claim 4, wherein between the carrier foils for the gradiometer loops and the feed foils rows of connecting points for the superconducting connecting leads are provided.

7. The gradiometer loop system recited in claim 1, wherein the superconducting connecting leads comprise twin leads of conductor runs which have opposed directions of current flow.

8. The gradiometer loop system recited in claim 3, wherein the superconducting connecting leads are at least largely shielded outside the array areas by means of conductor runs arranged on the respective opposite flat side of the carrier foils.

9. The gradiometer loop system recited in claim 1, wherein the foils carrying the gradiometer loops are each bent about an edge of the carrier body outside the region of their array area.

10. The gradiometer loop system recited in claim 1, wherein the gradiometer loops each have the shape of a regular hexagon.

* * * * *